US010000670B2

(12) United States Patent
Kuder et al.

(10) Patent No.: US 10,000,670 B2
(45) Date of Patent: Jun. 19, 2018

(54) SILVER SINTERING COMPOSITIONS WITH FLUXING OR REDUCING AGENTS FOR METAL ADHESION

(71) Applicant: Henkel IP & Holding GmbH, Duesseldorf (DE)

(72) Inventors: Harry Richard Kuder, Fullerton, CA (US); Juliet Grace Sanchez, Carson, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 340 days.

(21) Appl. No.: 13/827,117

(22) Filed: Mar. 14, 2013

(65) Prior Publication Data
US 2014/0030509 A1    Jan. 30, 2014

Related U.S. Application Data

(60) Provisional application No. 61/677,062, filed on Jul. 30, 2012.

(51) Int. Cl.
C09J 9/02 (2006.01)
H01B 1/22 (2006.01)
H01L 23/00 (2006.01)
H05K 1/09 (2006.01)
H05K 3/32 (2006.01)
C09D 5/24 (2006.01)

(52) U.S. Cl.
CPC ............................ *C09J 9/02* (2013.01); *C09D 5/24* (2013.01); *H01B 1/22* (2013.01); *H01L 24/29* (2013.01); *H05K 1/097* (2013.01); *H05K 3/321* (2013.01); *H01L 2224/29294* (2013.01); *H01L 2224/29339* (2013.01); *H01L 2224/8384* (2013.01); *Y10T 428/256* (2015.01)

(58) Field of Classification Search
CPC ...................................... H01B 1/22; C08K 5/14
See application file for complete search history.

(56) References Cited

U.S. PATENT DOCUMENTS

| 4,020,036 | A | 4/1977 | South, Jr. | |
|---|---|---|---|---|
| 4,101,604 | A | 7/1978 | Rowe | |
| 4,160,759 | A | 7/1979 | Gardner et al. | |
| 4,161,471 | A | 7/1979 | Kassal | |
| 4,186,244 | A | 1/1980 | Armstrong et al. | |
| 4,541,876 | A * | 9/1985 | Hwang | B23K 35/22 148/22 |
| 5,397,618 | A | 3/1995 | Cedarleaf | |
| 5,510,197 | A | 4/1996 | Takahashi et al. | |
| 5,717,034 | A | 2/1998 | Dershem et al. | |
| 6,036,889 | A | 3/2000 | Kydd | |
| 6,746,896 | B1 * | 6/2004 | Shi et al. | 438/108 |
| 7,422,707 | B2 | 9/2008 | Zhuo | |
| 7,722,786 | B2 | 5/2010 | Bao et al. | |
| 8,974,705 | B2 * | 3/2015 | Kuder et al. | 252/514 |
| 2002/0038582 | A1 | 4/2002 | Holl | |
| 2002/0062923 | A1 | 5/2002 | Forray | |
| 2002/0190370 | A1 * | 12/2002 | Shi et al. | 257/690 |
| 2003/0119226 | A1 | 6/2003 | Appelt et al. | |
| 2004/0191501 | A1 * | 9/2004 | Rasiah | 428/325 |
| 2006/0199883 | A1 | 9/2006 | Banba et al. | |
| 2006/0289837 | A1 | 12/2006 | McNeilly et al. | |
| 2007/0170403 | A1 | 7/2007 | Conaghan et al. | |
| 2007/0181858 | A1 | 8/2007 | Matsushima et al. | |
| 2008/0166543 | A1 * | 7/2008 | Zhuo | C09J 5/06 428/323 |
| 2008/0166552 | A1 * | 7/2008 | Cloud et al. | 428/337 |
| 2009/0134206 | A1 | 5/2009 | Schmitt et al. | |
| 2009/0236404 | A1 | 9/2009 | Yamakawa et al. | |
| 2009/0283725 | A1 | 11/2009 | Lee et al. | |
| 2009/0298283 | A1 * | 12/2009 | Akimoto et al. | 438/660 |
| 2010/0187678 | A1 | 7/2010 | Kajiwara et al. | |
| 2010/0243967 | A1 | 9/2010 | Hisaeda et al. | |
| 2010/0285233 | A1 | 11/2010 | Brasseur et al. | |
| 2011/0039018 | A1 | 2/2011 | Brown et al. | |
| 2012/0055707 | A1 * | 3/2012 | Schafer | B23K 35/025 174/260 |
| 2012/0069531 | A1 | 3/2012 | Das et al. | |
| 2012/0153011 | A1 | 6/2012 | Schaefer et al. | |
| 2012/0153012 | A1 | 6/2012 | Schaefer et al. | |
| 2012/0164429 | A1 | 6/2012 | Shah et al. | |
| 2013/0187102 | A1 | 7/2013 | Kuder et al. | |

FOREIGN PATENT DOCUMENTS

| CN | 1545731 | 11/2004 |
|---|---|---|
| CN | 101505911 A | 8/2009 |
| CN | 101965617 A | 2/2011 |

(Continued)

OTHER PUBLICATIONS

Okuma, Sadao. "The Sintering Mechanism of Aluminum and the Anodization of Aluminium Sintered Bodies." Electrocomponent Science and Technology, 1979, vol. 6, pp. 23-29.

"Aluminum—Aluminum Foil Production" The European Aluminum Foil Association. Dated Added May 28, 2002. Retrieved from http://www.azom.com/article.aspx?ArticleID=1434.

"High Thermal Silver Sintering Paste." Kyocera Fineceramics GmbH, . Published 2014, Retrieved from http://www.kyocera.be/index/products/electronica_2014.-cps-15051-files-60621-File.cpsdownload.tmp/High%20Thermal%20Silver%20Sintering%20Paste_V1_2.3.pdf.

(Continued)

*Primary Examiner* — Elizabeth A Robinson
(74) *Attorney, Agent, or Firm* — Steven C. Bauman

(57) ABSTRACT

A conductive composition that is sinterable comprises (i) micron- or submicron-sized silver flakes or powders and (ii) a fluxing agent, or an oxygenated solvent, or a peroxide. The composition can be used to adhere semiconductor dies with silver backing to copper-, silver-, or gold lead-frames at sintering temperatures of ≤250° C. without the application of pressure.

10 Claims, No Drawings

(56) References Cited

FOREIGN PATENT DOCUMENTS

| CN | 102027550 A | 4/2011 |
|---|---|---|
| CN | 102386149 A | 3/2012 |
| CN | 102922177 A | 2/2013 |
| CN | 103443866 A | 12/2013 |
| EP | 2396139 B1 | 5/2014 |
| JP | 2006009076 A | 1/2006 |
| JP | 2010180471 A | 8/2010 |
| JP | 2010-257880 A | 11/2010 |
| JP | 2012-052198 A | 3/2012 |
| JP | 2012-062531 A | 3/2012 |
| JP | 2013-216919 A | 10/2013 |
| RU | 2016114 C1 | 7/1994 |
| RU | 2075370 C1 | 3/1997 |
| RU | 2225587 C2 | 3/2004 |
| TW | 498349 B | 8/2002 |
| TW | 502049 B | 9/2002 |
| TW | 201003675 A1 | 2/2010 |
| WO | 2010109465 A1 | 9/2010 |
| WO | 2011003948 A2 | 1/2011 |
| WO | WO 2011026623 A1 * | 3/2011 ............ B22F 1/0062 |
| WO | 2012006511 A1 | 1/2012 |
| WO | 2012022011 A1 | 2/2012 |
| WO | 2013090570 A1 | 6/2013 |
| WO | 2015034579 A1 | 3/2015 |

OTHER PUBLICATIONS

Lu, et al. "Effects of Metallo-Organic Decomposition Agents on Thermal Decomposition and Electrical Conductivity of Low-Temperature-Curing Silver Paste." The Japan Society of Applied Physics, Japanese Journal of Applied Physics, 2006, vol. 45, No. 9a, pp. 6987-6992.

* cited by examiner

SILVER SINTERING COMPOSITIONS WITH FLUXING OR REDUCING AGENTS FOR METAL ADHESION

BACKGROUND OF THE INVENTION

Conductive adhesive compositions comprising an adhesive resin and conductive fillers are used in the fabrication and assembly of semiconductor packages and microelectronic devices, both to mechanically attach, and to create electrical and thermal conductivity between, integrated circuit devices and their substrates. The most commonly used conductive filler is silver flake. Adhesive resins are used in the conductive compositions because silver flake typically do not sufficiently adhere semiconductor or microelectronic devices to their substrate. The presence of the resin, however, limits the high thermal and electrical conductance of the silver.

Currently, conductive compositions containing only silver and no resin are being adhered with thermo-compression bonding, or no pressure bonding, to silver or gold substrates. However, substrates commonly used in the fabrication of electronic devices are copper lead-frames, and silver does not readily form an inter-metallic bond to copper. Solders have been used, but in high power and high temperature applications, solder fails when cycled at high temperatures or temperatures close to its melt temperature. Moreover, solder requires the presence of fluxing agents, which leave flux residues after the inter-metallic bond is formed, thus necessitating a cleaning step for the substrate.

It would be an advantage to have a silver composition containing no adhesive resin that can sinter and adhere to copper, and that can adhere with increased strength to silver and gold substrates than can now be obtained.

SUMMARY OF THE INVENTION

This invention is a conductive composition comprising (i) micron- or submicron-sized silver flakes and (ii) a fluxing agent or an oxygenated solvent or a peroxide, in the absence of an organic resin. The fluxing agent, peroxide, or oxygenated solvent will be chosen to be sufficiently volatile at the sintering temperature so that no residue remains in the composition after sintering. This composition sinters at temperatures of 250° C. or less, and can form an intermetallic bond with a copper substrate without the application of pressure. In another embodiment, this invention is an assembly of comprising a first substrate of silver or gold, a sintering composition, and a second substrate selected from copper, silver or gold, in which the sintering composition, comprising silver flakes and an oxygenated solvent or a peroxide or a fluxing agent, is disposed between the first and second substrates.

DETAILED DESCRIPTION OF THE INVENTION

Micron- or submicron-sized silver flakes are provided commercially with a coating of a fatty acid lubricant and/or surfactant to prevent agglomeration. Typical lubricants used by manufacturers of silver flake include stearic acid, isostearic acid, lauric acid, decanoic acid, oleic acid, palmitic acid, or fatty acids neutralized with amines such as imidazoles. Removal of the lubricant and/or surfactant facilitates the formation of inter-metallic bonds between the silver flakes in the conductive composition and the chosen metal substrate, and can be accomplished with the use of an oxygenated solvent or peroxide.

Examples of suitable oxygenated solvents are ketones, esters, glycol ethers and alcohols. These are used for high solvency and work to remove organics on the silver particles and substrate surfaces. Oxygenated solvents include 2-(2-ethoxy-ethoxy)-ethyl acetate, propylene glycol monoethyl ether, butylethoxy ethyl acetate, diethylene glycol monobutyl ether acetate, diethylene glycol, dipropylene glycol, monobutyl ether acetate, and propylene carbonate. Other suitable solvents include cyclic ketones, such as cyclooctanone, cycloheptanone, and cyclohexanone. The oxygenated solvent, when present, will be in an amount up to about 15% by weight of the total composition (but not 0%).

Examples of suitable peroxides include tertiary-butyl peroxy-2-ethylhexanoate, tertiary-butyl peroxyneodecanoate, dilauroyl peroxide, tertiary-butyl peroctoate, 1,1,3,3-tetramethylbutyl peroxy-2-ethyl hexanoate, di-tertiary-butyl peroxide, 2,5-bis-(tertiary-butylperoxy)-2,5-dimethyl hexane, and di-cumyl peroxide, di-tertiary-amyl peroxide. Peroxide, when present, will be in an amount from 0 to 2.0%, preferably 0.0 to 1.0%, by weight of the total composition.

Fluxing agents and reducing agents (hereinafter fluxing agents) are used as chemical cleaning agents to remove oxidation from metal surfaces of the metal flakes or substrates. Fluxing agents can become strongly reducing at elevated temperatures, thus preventing metal oxide formation. Fluxing and reducing agents can be used on silver powder, silver flakes, and silver coated particles, such as silver coated copper and silver coated glass. Examples of suitable fluxing agents include 2,2-6,6-tetramethyl-piperidinoxy, 4,4'-dithiodibutyric acid, succinic acid, 8-hydroxyquinoline, nitrolotrimethyl-phosphonic acid, triethanolamine, glutaric acid, malic acid, tartaric acid, acetylacetone, glycerin, dithiothreitol, 1,2,3-trihydroxy-benzene. Fluxing agent, when present, will be in an amount of 0.0 to 10.0%, preferably 0.5 to 5.0%, by weight of the total composition.

Conductive compositions comprising silver flakes and one of the oxygenated solvents, peroxides or fluxing agents described above are prepared at room temperature, deposited on a substrate, contacted with a second substrate, and then heated to the sintering temperature of the silver to adhere the two substrates together.

When used in semiconductor fabrication, these compositions have sufficient adhesion upon sintering without the use of any organic resin to adhere metal coated dies to metal coated substrates. In particular, the compositions can be used to adhere silver or gold coated semiconductor dies to copper lead-frames. In some embodiments the compositions of this invention will sinter at temperatures less than 250° C. In other embodiments, the compositions of this invention will sinter at temperatures less than 200° C. No pressure is needed to induce the sintering. At sintering temperatures, the lubricant and/or surfactant on the silver flakes, and the solvent, peroxide, or fluxing agent used in the composition are burned off, leaving only the sintered silver.

Various sintering profile schedules can be devised to suit the needs of the practitioner. Lower temperature and longer time period sintering profiles may be needed for large size dies, so that the solvent is more gradually removed, thereby assuring void free bond lines. Typical sintering profiles are given here, although it should be understood that other similar sintering profiles are anticipated to be equally effective. Examples of sintering profiles include: (i) a 30 minute ramp from room temperature to 220° C., followed by a 60 minute hold at 220° C.; (ii) a 15 minute ramp from room temperature to 110° C., followed by a 60 minute hold at 110° C., followed by a 60 minute hold at 240° C.; (iii) a 30 minute ramp from room temperature to 250° C., followed by a 60 minute hold at 250° C.; (iv) for a higher sintering temperature, a 60 minute ramp to 300° C., followed by a two hour hold at 300° C. No pressure is needed to accomplish the sintering of the compositions of this invention with these sintering profiles.

In another embodiment, this invention is an assembly comprising a first substrate of silver or gold, a sintering composition, and a second substrate selected from copper, silver or gold, in which the sintering composition, comprising silver flakes and an oxygenated solvent or a peroxide or a fluxing agent, is disposed between the first and second substrates.

The silver adhesives of this invention will find utility in assembly packages for the electronic industry requiring high power density, such as those used in semiconductor, automotive, high voltage, and solar cell applications.

EXAMPLES

Example 1

In this example, the following specimens were prepared and test protocols followed. Specimens were prepared using a composition with a fluxing agent, and a control composition without a fluxing agent. The compositions were mixed in a small dual centrifugal mixer (Speedmixer®) for 60 seconds at 1000 rpm, and then for 30 seconds at 1500 rpm. All specimens were submitted to sintering at a 30 minute ramp from ambient temperature to 250° C., and a hold for 60 minutes at 250° C. No pressure was used.

Die shear was measured using a Dage 4000 series Die Shear Tester having a heater adapter plate capable of reaching 350° C. and achieving at least 50 kg force. The compositions were coated onto 3×3 mm$^2$ silver coated dies and contacted to bare copper lead-frames, silver coated copper lead-frames, and gold coated copper lead-frames typical to the semiconductor industry. The specimens were sintered according to the sintering profile stated above. The die shear target was greater than or equal to 1.0 Kg/mm$^2$.

Volume resistivity was measured using an Agilent 34401A digital multimeter or QuadTech 1689 RLC Digibridge. The test vehicle was a glass slide onto which was coated 50 microns×0.25-mm×25.4-mm of silver adhesive, which was sintered according to the sintering profile stated above. At least three samples were tested multiple times for validation and repeatability and the results pooled and averaged.

Thermal conductivity was measured using a Holometrix Micro Flash-Laser Thermal Properties Instrument. The test samples were free-standing silver adhesive discs, 0.5-mm×12.5-mm, sintered according to the sintering profile stated above. A minimum of two samples were tested multiple times for validation and repeatability and the results pooled and averaged.

Viscosity measurements were made using a Brookfield DV-III with cone and plate CP51 at 25.0° C. Viscosity was measured at 1.92 sec$^{-1}$ and 19.2 sec$^{-1}$ shear rates.

DSC was measured by TA Instrument Q20 at 10° C./min ramp from 25° C. to 350° C. The compositions of the inventive sample and the control in parts by weight (pbw), and the results of the performance testing are set out in the following table:

|  | CONTROL | INVENTIVE SAMPLE A |
|---|---|---|
| COMPOSITION COMPONENTS |  |  |
| Silver flake (FA-SAB-195, Dowa) | 100.0 pbw | 100.0 pbw |
| Propylene carbonate (oxygenated solvent) | 14.0 | 14.0 |
| Di-tert-butyl peroxide (lubricant remover) | 0.5 | 0.5 |
| Acetylacetone (fluxing agent) |  | 1.0 |
| PERFORMANCE RESULTS |  |  |
| Viscosity (cps) | 43500 | 21460 |
| Volume Resistivity (ohm-cm) | 1.2 × 10$^{-5}$ | 1.0 × 10$^{-5}$ |
| Thermal Conductivity (W/m ° K) | 83 | 80 |
| DSC Onset Temperature (° C.) | 223 | 221 |
| DSC Peak Temperature (° C.) | 263 | 261 |
| DSC Exotherm Heat of Reaction (J/g) | 87 | 86 |
| Die Shear Strength under N$_2$, (Kg/mm$^2$) |  |  |
| Ag lead-frame | 1.6 | 2.7 |
| Cu lead-frame | 0.9 | 2.2 |
| NiPdAu lead-frame | 1.6 | 1.9 |
| Die Shear Strength in air, (Kg/mm$^2$) |  |  |
| Ag lead-frame | 1.6 | 3.4 |
| Cu lead-frame | 0.6 | 1.4 |
| NiPdAu lead-frame | 2.3 | 3.7 |

The results show a higher die shear strength on all lead-frames with the composition containing fluxing agent, oxygenated solvent, and peroxide.

Example 2

In this example, the silver sintering compositions contained no fluxing agent, and one contained no peroxide. Both samples contained an oxygenated solvent. The TNA die is a titanium-nickel-silver coated silicon die. Ag-LF is a silver leadframe. Cu-LF is a copper leadframe, and PPF-LF is a nickel-palladium-gold flashed (gold surface) leadframe. RT is room temperature. Performance tests were conducted as described in Example 1. The data show that a composition consisting essentially of silver flake and oxygenated solvent will sinter and provide sufficient die shear strength for commercial application.

|  | B (g) | | C (g) | |
|---|---|---|---|---|
| FORMULATION: |  |  |  |  |
| Silver flake (DOWA FA-SAB-237) | 100.0 | | 100.0 | |
| Propylene carbonate (oxygenated solvent) | 14.0 | | 14.0 | |
| Peroxide (Luperox DI) | 0.5 | | None | |
| PHYSICAL PROPERTIES | N$_2$ SINTER | AIR SINTER | N$_2$ SINTER | AIR SINTER |
| Volume Resistivity (ohm-cm) | 0.6 × 10$^{-5}$ | 0.6 × 10$^{-5}$ | 0.5 × 10$^{-5}$ | 0.6 × 10$^{-5}$ |
| Thermal conductivity (W/m ° K) | 116 | 126 | 123 | 120 |
| Die shear @ RT (Kg/mm$^2$) |  |  |  |  |
| TNA Die to Ag-LF | 1.9 | 3.3 | 2.6 | 3.0 |
| TNA Die to Cu-LF | 1.4 | 1.7 | 1.3 | 1.3 |
| TNA Die to PPF-LF | 2.5 | 3.1 | 2.6 | 3.7 |

-continued

|  | B (g) | | C (g) | |
|---|---|---|---|---|
| Die shear @ 270° C. (Kg/mm$^2$) | | | | |
| TNA Die to Ag-LF | 2.3 | 2.4 | 2.7 | 2.7 |
| TNA Die to Cu-LF | 1.2 | 1.5 | 1.3 | 1.3 |
| TNA Die to PPF-LF | 2.4 | 2.6 | 2.5 | 2.7 |

Example 3

In this example, formulations were prepared as shown in the following table: one formulation contained peroxide and an oxygenated solvent; one contained only oxygenated solvent; and one contained only fluxing agent. Performance tests were performed as described in Example 1, except where noted in the table, and show that formulations consisting essentially of silver flake and fluxing agent, or silver flake and oxygenated solvent, will sinter and provide sufficient die shear strength for commercial application.

The data show that the absence of peroxide has no appreciable effect on the performance properties of the sintering formulations with fluxing agent.

Example 4

In this example, formulations were prepared as shown in the following table: one formulation contained an oxygenated solvent; one formulation contained only peroxide; and one formulation contained only fluxing agent. Performance tests were performed as described in Example 1, except where noted in the table, and show that formulations consisting essentially of silver flake and fluxing agent, or silver flake and oxygenated solvent, will sinter and provide sufficient thermal and electrical performance and some die shear strength conditions for commercial application.

|  | D (g) | E' (g) | E (g) | F (g) |
|---|---|---|---|---|
| FORMULATION COMPONENTS | | | | |
| Silver flake (DOWA FA-SAB-237) | 100.0 | 100.0 | 100.0 | 100.0 |
| Peroxide (Luperox DI) | 0.5 | | | |
| Propylene Carbonate (oxygenated solvent) | 14.0 | 14.0 | 14.0 | |
| Dipropylene glycol (solvent) | | | | 5.0 |
| Diethylene glycol monobuty ether acetate (solvent) | | | | 5.0 |
| Acetylacetone (fluxing agent) | | | 5.0 | 5.0 |
| PERFORMANCE RESULTS: RHEOLOGY | | | | |
| Viscosity at 5.0 rpm | 15990 | 21375 | 5137 | 5137 |
| Thixotropic index | 6.9 | 5.8 | 7.9 | 6.8 |
| VOLUME RESISTIVITY (ohm-cm) | | | | |
| Sinter 30-min ramp + 60 min at 250° C./N$_2$ | 6.3E−06 | 5.3E−06 | 7.3E−06 | 6.3E−06 |
| Sinter 30-min ramp + 60 min at 250° C./air | 6.0E−06 | 6.3E−06 | 7.7E−06 | 7.3E−06 |
| THERMAL CONDUCTIVITY (W/m ° K) | | | | |
| Sinter Cure 30-min ramp + 60 min at 250° C./N$_2$ | 116.2 | 123.3 | 85.2 | 75.9 |
| Sinter Cure 30-min ramp + 60 min at 250° C./air | 126.0 | 120.3 | 99.3 | 152.2 |
| DIE SHEAR STRENGTH; 3 × 3 mm$^2$ TNA-die/Ag-Lead-frames | | | | |
| Sinter 250° C., N$_2$, tested at 25° C. | 1.9 | 2.6 | 2.2 | 2.7 |
| Sinter 250° C., N$_2$, tested at 270° C. | 2.3 | 2.7 | 2.5 | 2.7 |
| Sinter 250° C., air, tested at 25° C. | 3.3 | 3.0 | 3.5 | 3.0 |
| Sinter 250° C., air, tested at 270° C. | 2.4 | 2.7 | 2.7 | 2.4 |
| DIE SHEAR STRENGTH; 3 × 3 mm$^2$ TNA-die/Cu-lead-frames | | | | |
| Sinter 250° C., N$_2$, tested at 25° C. | 1.4 | 1.3 | 1.4 | 1.2 |
| Sinter 250° C., N$_2$, tested at 270° C. | 1.2 | 1.3 | 1.3 | 1.0 |
| Sinter 250° C., air, tested at 25° C. | 1.7 | 1.3 | 1.7 | 2.8 |
| Sinter 250° C., air, tested at 270° C. | 1.5 | 1.3 | 1.6 | 2.2 |
| DIE SHEAR STRENGTH; 3 × 3 mm$^2$ TNA-die/NiPdAu lead-frame | | | | |
| Sinter 250° C., N$_2$, tested at 25° C. | 2.5 | 2.6 | 2.2 | 2.5 |
| Sinter Cure 250° C., N$_2$, tested at 270° C. | 2.4 | 2.5 | 2.3 | 2.5 |
| Sinter 250° C., air, tested at 25° C. | 3.1 | 3.7 | 3.9 | 3.5 |
| Sinter 250° C., air, tested at 270° C. | 2.6 | 2.7 | 2.6 | 2.8 |

| | H (g) [E] | I (g) | G (g) |
|---|---|---|---|
| FORMULATION COMPONENTS | | | |
| Silver flake (DOWA FA-SAB-237) | 100.0 | 100.0 | 100.0 |
| Propylene Carbonate (oxygenated solvent) | 14.0 | | |
| Peroxide (Luperox DI) | | 10.0 | |
| Acetylacetone (fluxing agent) | | | 15.0 |
| PERFORMANCE RESULTS: RHEOLOGY | | | |
| Viscosity at 5.0 rpm | 21375 | 3230 | 4805 |
| Thixotropic index | 5.8 | 9.0 | 6.9 |
| VOLUME RESISTIVITY (ohm-cm) | | | |
| Sinter 30-min ramp + 60 min at 250° C./$N_2$ | 5.3E−06 | 4.3E−06 | 6.0E−06 |
| Sinter 30-min ramp + 60 min at 250° C./air | 6.3E−06 | 4.3E−06 | 7.0E−06 |
| THERMAL CONDUCTIVITY (W/m ° K) | | | |
| Sinter Cure 30-min ramp + 60 min at 250° C./$N_2$ | 123 | 142 | 123 |
| Sinter Cure 30-min ramp + 60 min at 250° C./air | 120 | 148 | 129 |
| DIE SHEAR STRENGTH; 3 × 3 mm² TNA-die/Ag-Lead-frames | | | |
| Sinter 250° C., $N_2$, tested at 25° C. | 2.6 | 0.6 | 0.9 |
| Sinter 250° C., $N_2$, tested at 270° C. | 2.7 | 0.9 | 1.0 |
| Sinter 250° C., air, tested at 25° C. | 3.0 | 0.3 | 0.2 |
| Sinter 250° C., air, tested at 270° C. | 2.7 | 0.2 | 0.3 |
| DIE SHEAR STRENGTH; 3 × 3 mm² TNA-die/Cu-lead-frames | | | |
| Sinter 250° C., $N_2$, tested at 25° C. | 1.3 | 0.7 | 1.0 |
| Sinter 250° C., $N_2$, tested at 270° C. | 1.3 | 0.4 | 0.7 |
| Sinter 250° C., air, tested at 25° C. | 1.3 | 0.5 | 0.4 |
| Sinter 250° C., air, tested at 270° C. | 1.3 | 0.4 | 0.2 |
| DIE SHEAR STRENGTH; 3 × 3 mm² TNA-die/NiPdAu lead-frame | | | |
| Sinter 250° C., $N_2$, tested at 25° C. | 2.6 | 0.2 | 0.5 |
| Sinter Cure 250° C., $N_2$, tested at 270° C. | 2.5 | 0.4 | 0.3 |
| Sinter 250° C., air, tested at 25° C. | 3.7 | 0.7 | 0.4 |
| Sinter 250° C., air, tested at 270° C. | 2.7 | 0.4 | 0.2 |

The invention claimed is:

1. A conductive composition consisting of:
   (i) micron- or submicron-sized silver flakes comprising a coating of a fatty acid lubricant and/or surfactant,
   (ii) a fluxing agent selected from the group consisting of 2,2,6,6-tetramethylpiperidinoxy, 4,4'-dithiodibutyric acid, succinic acid, 8-hydroxyquinoline, nitrolotrimethylphosphonic acid, triethanolamine, glutaric acid, malic acid, tartaric acid, acetylacetone, dithiothreitol, and 1,2,3-trihydroxy-benzene, and
   (iii) a peroxide and
   (iv) an oxygenated solvent selected from the group consisting of 2-(2-ethoxy-ethoxy)-ethyl acetate, propylene glycol monoethyl ether, diethylene glycol monobutyl ether acetate, monobutyl ether acetate, and propylene carbonate.

2. The conductive composition according to claim 1 wherein the fluxing agent is present in the composition in an amount of 0.1 to 10.0% by weight of the total composition.

3. The conductive composition according to claim 1 wherein the oxygenated solvent is present in an amount of 0.1 to 15.0% by weight of the total composition.

4. The conductive composition according to claim 1 wherein the peroxide is selected from the group consisting of tertiary-butyl peroxy-2-ethylhexanoate, tertiary-butyl peroxyneo-decanoate, dilauroyl peroxide, tertiary-butyl peroctoate, 1,1,3,3-tetramethylbutyl peroxy-2-ethyl hexanoate, di-tertiary-butyl peroxide, 2,5-bis-(tertiary-butylperoxy)-2,5-dimethyl hexane, di-cumyl peroxide, and di-tertiary-amyl peroxide.

5. The conductive composition according to claim 4 wherein the peroxide is present in an amount of greater than 0.0 up to 1.0% by weight of the total composition.

6. An assembly comprising a first substrate of silver, a conductive composition, and a second substrate selected from copper, silver or gold, in which the conductive composition consists of
   (i) micron- or submicron-sized silver flakes comprising a coating of a fatty acid lubricant and/or surfactant,
   (ii) a fluxing agent selected from the group consisting of 2,2,6,6-tetramethylpiperidinoxy, 4,4'-dithiodibutyric acid, succinic acid, 8-hydroxyquinoline, nitrolotrimethylphosphonic acid, triethanolamine, glutaric acid, malic acid, tartaric acid, acetylacetone, dithiothreitol, and 1,2,3-trihydroxy-benzene, and
   (iii) a peroxide and
   (iv) oxygenated solvent selected from the group consisting of 2-(2-ethoxy-ethoxy)-ethyl acetate, propylene glycol monoethyl ether, diethylene glycol monobutyl ether acetate, monobutyl ether acetate, and propylene carbonate,
   wherein said composition is disposed between the first and second substrates.

7. The assembly according to claim 6 wherein the fluxing agent is present in the composition in an amount of 0.1 to 10.0% by weight of the total composition.

8. The assembly according to claim 6 wherein the oxygenated solvent is present in an amount of 0.1 to 15.0% by weight of the total composition.

9. The assembly according to claim 6 wherein peroxide is selected from the group consisting of tertiary-butyl peroxy-2-ethylhexanoate, tertiary-butyl peroxyneo-decanoate, dilauroyl peroxide, tertiary-butyl peroctoate, 1,1,3,3-tetramethylbutyl peroxy-2-ethyl hexanoate, di-tertiary-butyl peroxide, 2,5-bis-(tertiary-butylperoxy)-2,5-dimethyl hexane, di-cumyl peroxide, and di-tertiary-amyl peroxide.

10. The assembly according to claim 9 wherein the peroxide is present in an amount of greater than 0.0 up to 1.0% by weight of the total composition.

* * * * *